US010894407B2

(12) United States Patent
Wang

(10) Patent No.: US 10,894,407 B2
(45) Date of Patent: Jan. 19, 2021

(54) DEVICE INCLUDING ACTUATOR

(71) Applicant: BROTHER KOGYO KABUSHIKI KAISHA, Nagoya (JP)

(72) Inventor: Rui Wang, Nagoya (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 521 days.

(21) Appl. No.: 15/899,500

(22) Filed: Feb. 20, 2018

(65) Prior Publication Data

US 2018/0281408 A1 Oct. 4, 2018

(30) Foreign Application Priority Data

Mar. 29, 2017 (JP) ................................ 2017-065668

(51) Int. Cl.
*B41J 2/14* (2006.01)
*H01L 41/047* (2006.01)
*H01L 41/09* (2006.01)

(52) U.S. Cl.
CPC .. *B41J 2/14233* (2013.01); *B41J 2002/14241* (2013.01); *B41J 2002/14459* (2013.01); *B41J 2002/14491* (2013.01)

(58) Field of Classification Search
CPC .......... B41J 2/14233; B41J 2002/14241; B41J 2002/14459; B41J 2002/14491
USPC .................................................. 310/311–371
See application file for complete search history.

(56) References Cited

U.S. PATENT DOCUMENTS 10,707,407 B2 * 7/2020 Kiyose .................... H01L 41/33
2012/0026248 A1 2/2012 Kim et al.
2016/0185116 A1 6/2016 Kakiuchi et al.

FOREIGN PATENT DOCUMENTS

JP 2012-30572 A 2/2012
JP 2016-124153 A 7/2016

* cited by examiner

*Primary Examiner* — Thomas M Dougherty
(74) *Attorney, Agent, or Firm* — Merchant & Gould P.C.

(57) ABSTRACT

There is provided a device including: an actuator, a first flexible substrate and a second flexible substrate. The actuator includes a substrate; a first piezoelectric element and a second piezoelectric element that are formed on one surface of the substrate; a first contact connected to the first piezoelectric element; a second contact separated in a thickness direction of the substrate from the first contact and connected to the second piezoelectric element. The first flexible substrate is connected to the first contact; and the second flexible substrate is connected to the second contact.

19 Claims, 7 Drawing Sheets

DEVICE INCLUDING ACTUATOR

CROSS REFERENCE TO RELATED APPLICATION

The present application claims priority from Japanese Patent Application No. 2017-065668 filed on Mar. 29, 2017, the disclosures of which is incorporated herein by reference in its entirety.

BACKGROUND

Field of the Invention

The present teaching relates to a device including an actuator that drives a piezoelectric element.

Description of the Related Art

There has been publicly known an actuator that includes: a substrate; a plurality of first piezoelectric elements arranged in parallel in a certain direction, on said substrate; and a plurality of second piezoelectric elements arranged in parallel in the certain direction, adjacently to said first piezoelectric elements.

A plurality of contacts are lined up in the certain direction in an edge portion of the substrate. The first piezoelectric elements are connected to the contacts via traces. The second piezoelectric are connected to the contacts via traces.

SUMMARY

Since the contacts are lined up, a dimension of a space between adjacent two contacts is shorter than a dimension of a space between adjacent two first piezoelectric elements or a dimension of a space between adjacent two second piezoelectric elements. Therefore, it has been necessary for positioning to be performed accurately during joining of the contacts and other members. Moreover, since a dimension of a space between adjacent traces is also short, there is a risk of a short circuit occurring between traces.

The present teaching was made in view of such circumstances, and has an object of providing an actuator in which shortening of the dimension of the space between adjacent two contacts can be suppressed.

In accordance to an aspect of the present teaching, there is provided a device including an actuator, a first flexible substrate and a second flexible substrate. The actuator includes: a substrate; a first piezoelectric element located on one surface of the substrate; a second piezoelectric element located on the one surface of the substrate; a first contact connected to the first piezoelectric element; and a second contact separated in a thickness direction of the substrate from the first contact and connected to the second piezoelectric element. The first flexible substrate is connected to the first contact; and the second flexible substrate is connected to the second contact.

In the actuator according to the present teaching, the first contact and the second contact are separated in the thickness direction of the substrate. When a plurality of the first contacts and the second contacts have been lined up in a direction parallel to the substrate, the first contact and the second contact never make contact even if the first contact and the second contact are closely adjacent in the direction parallel to the substrate, since the first contact and the second contact are separated in the thickness direction.

Therefore, a dimension of a space between adjacent two first contacts can be set without particular attention being paid to a dimension of a space between the first contact and the second contact. Moreover, a dimension of a space between adjacent two second contacts can be set without particular attention being paid to the dimension of the space between the first contact and the second contact. That is, the dimension of the space between two first contacts and the dimension of the space between two second contacts can be set to dimensions that do not require accurate positioning and that, moreover, make it difficult for a short circuit to occur between traces.

Furthermore, the first contact and the second contact are connected to different flexible substrates, hence short circuits between the flexible substrates and the contacts during adhesion can be prevented more, and there is less need for accurate positioning for adhesion, compared to when the first contact and the second contact are in the same plane.

DESCRIPTION OF THE EMBODIMENTS

First Embodiment

Figure 1:
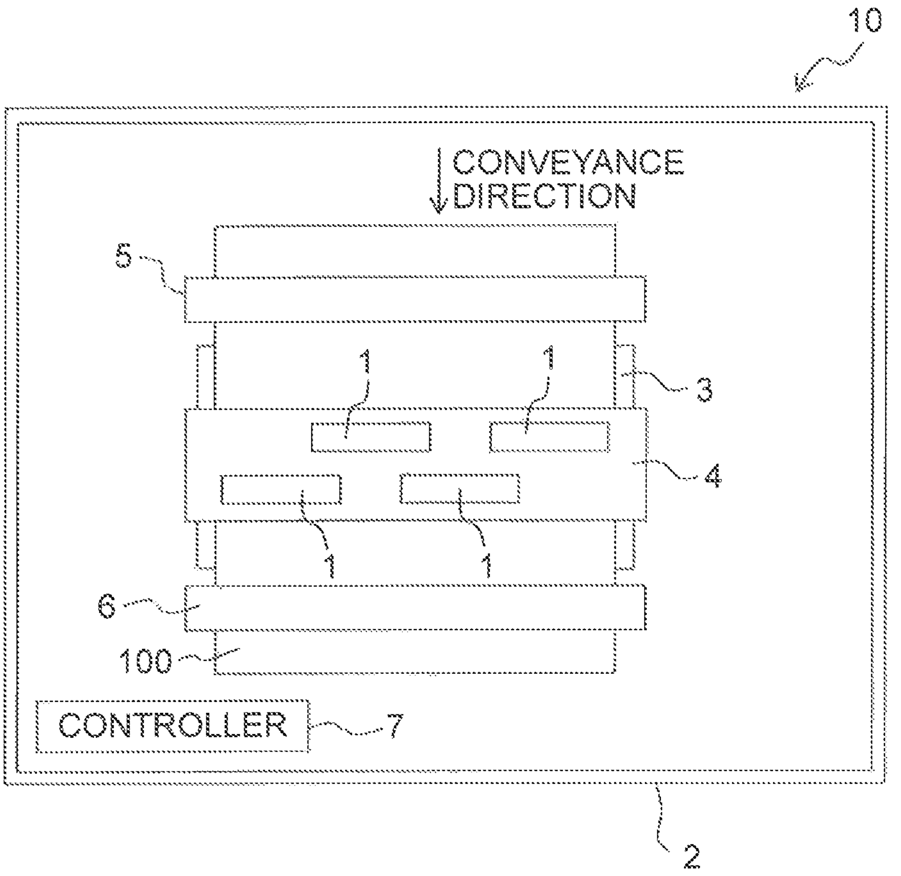
FIG. 1 is a plan view depicting schematically a printer 10 according to a first embodiment.

The present teaching will be described below based on drawings depicting a printer 10 according to a first embodiment. In FIG. 1, a downstream in a conveyance direction of a recording sheet 100 is defined as a front of the printer 10, and an upstream in the conveyance direction of the recording sheet 100 is defined as a rear of the printer 10. In addition, a sheet width direction parallel to a surface along which the recording sheet 100 is conveyed (a surface parallel to the paper surface of FIG. 1) and orthogonal to the previously described conveyance direction, is defined as a left-right direction of the printer 10. Moreover, a direction orthogonal to a conveyance surface of the recording sheet 100 (a direction orthogonal to the paper surface of FIG. 1) is defined as an up-down direction of the printer 10. Description will be carried out below making appropriate use of front/rear, left/right, and up/down.

As depicted in FIG. 1, the printer 10 includes a casing 2, a platen 3, an ink-jet head 4, two conveyance rollers 5, 6, and a control circuit 7.

The platen 3 is disposed within the casing 2. The ink-jet head 4 is arranged in parallel in a front-rear direction above the platen 3. The two conveyance rollers 5, 6 are respectively disposed on a rear side and a front side of the platen 3. The conveyance roller 5 conveys the recording sheet 100 toward the platen 3. Furthermore, the conveyance rollers 5, 6 cooperate to convey to a downstream in the conveyance direction the recording sheet 100 on the platen 3.

The control circuit 7 includes the likes of an FPGA (Field Programmable Gate Array), a ROM (Read Only Memory), and a RAM (Random Access Memory).

The control circuit 7, while causing the conveyance rollers 5, 6 to convey the recording sheet 100 in the conveyance direction, controls the ink-jet head 4 to discharge ink toward the recording sheet 100. The casing 2 holds each of the ink-jet heads 4 in a position above the platen 3 and between the two conveyance rollers 5, 6.

The ink-jet head 4 discharges inks of each of the four colors of cyan (C), magenta (M), yellow (Y), and black (K). Inks of corresponding colors are supplied from unillustrated ink tanks, to the ink-jet head 4. The ink-jet head 4 has a plurality of head units 1 provided in its lower section. A plurality of nozzles 11*n* are formed in a lower surface of the head unit 1.

A configuration of the head unit 1 will be described with reference to FIGS. 2 and 3. The head unit 1 has a channel-substrate 11, an actuator 12, a first flexible substrate 35, and a second flexible substrate 39.

Figure 2:
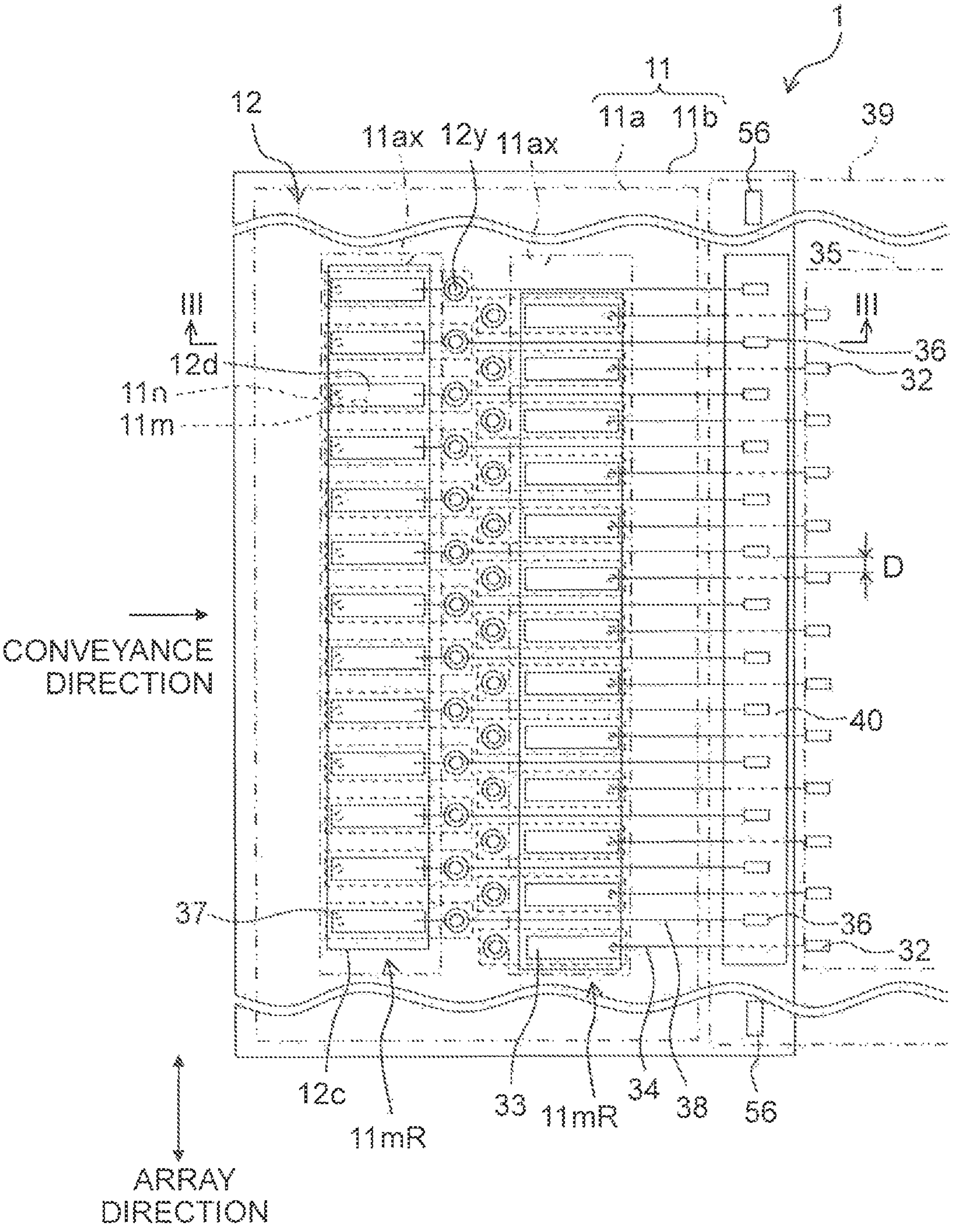
FIG. 2 is a plan view depicting schematically an actuator 12.
Figure 3:
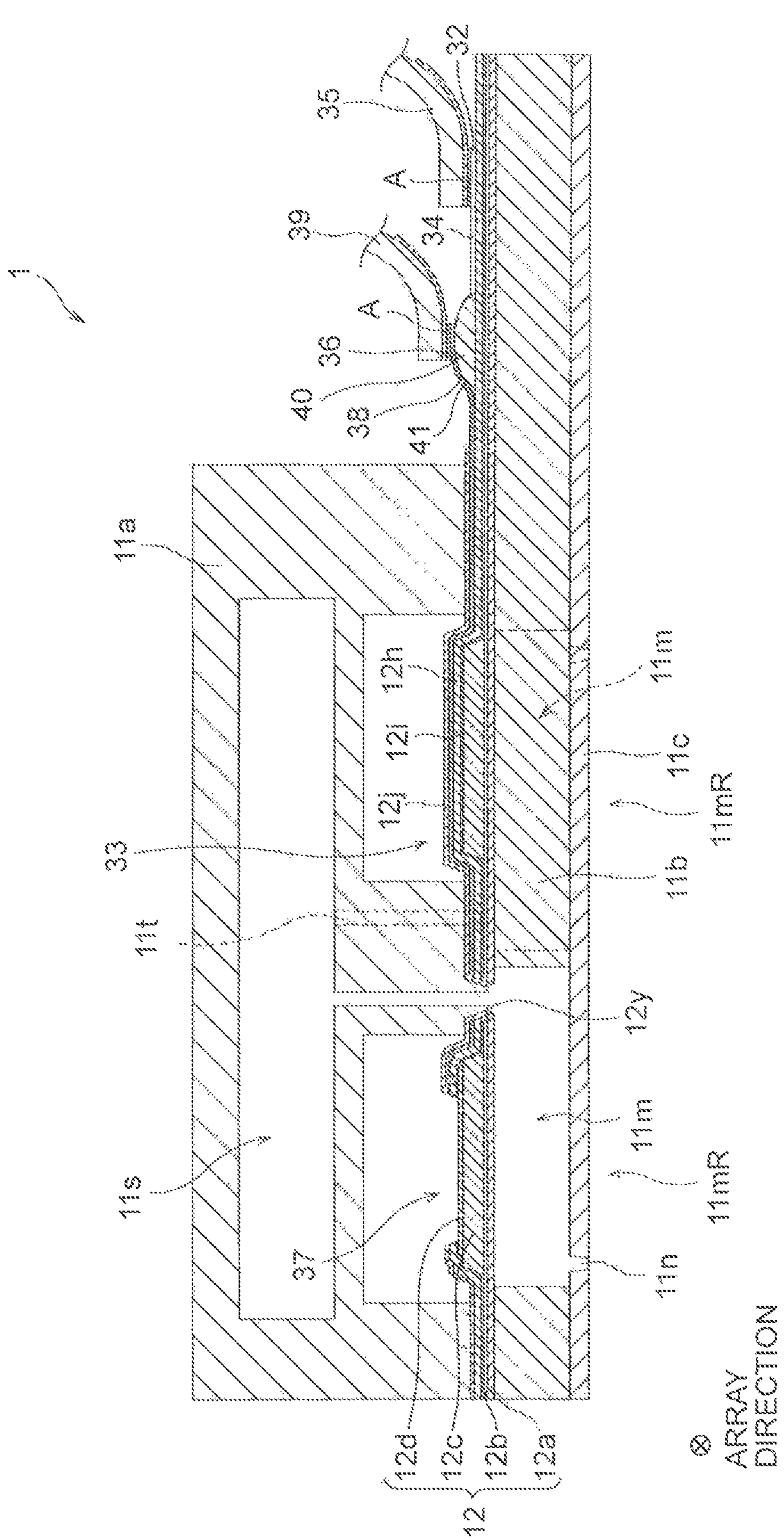
FIG. 3 is a schematic cross-sectional view of the actuator 12 taken along the line III-III depicted in FIG. 2.

As depicted in FIG. 3, the channel-substrate 11 has a reservoir member 11*a*, a pressure chamber plate 11*b*, and a nozzle plate 11*c*, and these plate members 11*a* to 11*c* are adhered to each other. As depicted in FIGS. 2 and 3, a reservoir 11*s*, a plurality of pressure chambers 11*m*, and a plurality of the nozzles 11*n* are formed in the channel-substrate 11.

The pressure chamber plate 11*b* is a silicon single crystal substrate, and the plurality of pressure chambers 11*m* are formed as through holes. As depicted in FIG. 2, the plurality of pressure chambers 11*m* are lined up in columns so as to configure two pressure chamber columns 11*m*R. The plurality of pressure chambers 11*m* configuring each of the pressure chamber columns 11*m*R are arranged equally spaced in an arrangement direction (a direction orthogonal to the conveyance direction). The two pressure chamber columns 11*m*R are aligned in a direction orthogonal to the arrangement direction (a direction parallel to the conveyance direction). The plurality of pressure chambers 11*m* are arranged in a zigzag manner such that their positions in the arrangement direction respectively differ.

The nozzle plate 11*c* has the plurality of nozzles 11*n* formed therein as through holes. The plurality of nozzles 11*n* communicate with respective ones of the plurality of pressure chambers 11*m*. The plurality of nozzles 11*n* have the same shape and size as each other. The nozzle plate 11*c* is adhered to a lower surface of the pressure chamber plate 11*b*.

As depicted in FIG. 2, the plurality of nozzles 11*n* are arranged in two columns, similarly to the plurality of pressure chambers 11*m*. The plurality of nozzles 11*n* are arranged in a zigzag manner such that their positions in the arrangement direction respectively differ. Capacities of the corresponding pressure chambers 11*m* change due to drive of piezoelectric elements 33, 37 of the actuator 12. As a result, ink is discharged from the plurality of nozzles 11*n*.

As depicted in FIG. 3, the actuator 12 is disposed on an upper surface of the pressure chamber plate 11*b*. The actuator 12 includes, in order from below, a substrate 12*a*, a common electrode 12*b*, a pair of piezoelectric bodies 12*c*, and a plurality of individual electrodes 12*d*.

The substrate 12*a* is a silicon dioxide film formed by oxidizing a surface of the silicon single crystal substrate configuring the pressure chamber plate 11*b*, and is formed on substantially the whole of the upper surface of the pressure chamber plate 11*b*. The common electrode 12*b* is an electrode provided commonly to the plurality of pressure chambers 11*m*, and is formed on substantially the whole of an upper surface of the substrate 12*a*.

The pair of piezoelectric bodies 12*c* are configured from a piezoelectric material such as lead zirconate titanate (PZT), and, on an upper surface of the common electrode 12*b*, each extend in the arrangement direction and cover the plurality of pressure chambers 11*m* configuring each of the pressure chamber columns 11*m*R.

The plurality of individual electrodes 12*d* respectively correspond to the plurality of pressure chambers 11*m*. The plurality of individual electrodes 12*d* are disposed in positions facing respective ones of the plurality of pressure chambers 11*m*, on an upper surface of each of the piezoelectric bodies 12*c*.

A portion sandwiched by the individual electrode 12*d* and the common electrode 12*b*, of the piezoelectric body 12*c* functions as the piezoelectric element 33 or 37 (an active section) capable of deforming based on application of a voltage to the individual electrode 12*d*. That is, the actuator 12 has a plurality of piezoelectric elements 33, 37 facing the pressure chambers 11*m*. Due to the piezoelectric element 33 or 37 facing the pressure chamber 11*m* being driven, the substrate 12*a* facing the pressure chamber 11*m* deforms and vibrates. As a result, capacity of the pressure chamber 11*m* changes, a pressure is applied to ink in the pressure chamber 11*m*, and ink is discharged from the nozzle 11*n*.

The actuator 12 is further provided with a piezoelectric body protective film 12*h*, an interlayer insulating film 12*i*, a first trace 34, a second trace 38, and a trace protective film 12*j*.

The piezoelectric body protective film 12*h* has a function of preventing infiltration into the piezoelectric body 12*c* of moisture in the air, and covers the pair of piezoelectric bodies 12*c*. The piezoelectric body protective film 12*h* is formed by aluminum oxide (alumina: $Al_2O_3$), for example. Note that in order to prevent drive of the piezoelectric elements 33, 37 being hindered, the piezoelectric body protective film 12*h* covers only a peripheral edge section of each of the individual electrodes 12*d*, and a central section of each of the individual electrodes 12*d* is exposed from the piezoelectric body protective film 12*h*.

The interlayer insulating film 12*i* has a function of increasing insulation between the traces 34, 38 and the common electrode 12*b*, and is provided between the piezoelectric body protective film 12*h* and the traces 34, 38. The interlayer insulating film 12*i* is formed by silicon dioxide ($SiO_2$), for example.

The plurality of traces 34, 38 are formed on an upper surface of the interlayer insulating film 12*i*, and are connected to respective ones of the plurality of individual electrodes 12*d*. Each of the traces 34, 38 is filled into a through hole penetrating the piezoelectric body protective film 12*h* and the interlayer insulating film 12*i*, and is electrically connected to each of the individual electrodes 12*d*.

As depicted in FIG. 2, the plurality of traces 34, 38 are each led out to a downstream in the conveyance direction and each extend to a portion not covered by the reservoir member 11*a* in the pressure chamber plate 11*b*. A first contact 32 or a second contact 36 is formed at a tip of the trace connected to the individual electrode 12*d* facing the pressure chamber 11*m*, of the plurality of traces 34, 38.

A pair of common contacts 56 are further provided on the upper surface of the interlayer insulating film 12*i* so as to sandwich the second contacts 36 in the arrangement direction. The pair of common contacts 56 are filled into through holes penetrating the interlayer insulating film 12*i* and the piezoelectric body protective film 12*h*, and are electrically connected to the common electrode 12*b*. A width (a length in the arrangement direction) of each of the common contacts 56 is larger than a width of each of the contacts 32, 36. A comparatively large gap is formed between each of the common contacts 56 and the contacts 32, 36.

The trace protective film 12*j* has a function of increasing insulation between the plurality of traces 34, 38, and is provided on the upper surface of the interlayer insulating film 12*i* so as to cover the plurality of traces 34, 38. The trace protective film 12*j* is formed by silicon nitride (SiNx), for example. Note that the contacts 32, 36, 56 are not covered by the trace protective film 12*j*.

As depicted in FIG. 3, the reservoir member 11*a* has the following formed therein, namely: the reservoir 11*s*; a plurality of communicating flow paths 11*t* that communicate the reservoir 11*s* and respective ones of the plurality of pressure chambers 11*m*; and a pair of recessed sections 11*ax* each extending in the arrangement direction. The reservoir member 11*a* is adhered, via the actuator 12, to the upper surface of the pressure chamber plate 11*b*, such that the pair of piezoelectric bodies 12*c* are respectively housed within the pair of recessed sections 11*ax*. A plurality of through holes 12*y* are respectively formed in portions corresponding to the plurality of communicating flow paths 11*t*, of the actuator 12. The reservoir member 11*a* seals the piezoelectric body 12*c* and protects the piezoelectric elements 33, 37 from the likes of humidity, air, and dust.

The reservoir 11*s* communicates, via a tube or the like, with a cartridge that stores ink. The ink in the cartridge is supplied to the reservoir 11*s* by drive of a pump (illustration of which is omitted), and passes through the plurality of communicating flow paths 11*t* and the plurality of through holes 12*y* to be supplied to the plurality of pressure chambers 11*m* configuring each of the pressure chamber columns 11*m*R. Ink supplied to each of the pressure chambers 11*m* is discharged from the nozzle 11*n* by drive of the piezoelectric elements 33, 37.

The head unit 1 includes the actuator 12. As depicted in FIGS. 2 and 3, the actuator 12 includes the substrate 12*a*. A plurality of the first piezoelectric elements 33 are lined up in the arrangement direction in a central section of a substrate 12*a* upper surface. The plurality of first piezoelectric elements 33 are covered by the reservoir member 11*a*. A plurality of the first contacts 32 are lined up in the arrangement direction in a front edge section of the substrate 12*a* upper surface.

Each of the first contacts 32 and each of the first piezoelectric elements 33 are connected via the first trace 34. The first trace 34 extends to a front side from below the reservoir member 11*a* covering the first piezoelectric element 33. An insulating film 40 extending in the arrangement direction is formed in a front section of the substrate 12*a* upper surface. The insulating film 40 is disposed on an upper side of the first trace 34. The insulating film 40 has an inclined surface 41. The inclined surface 41 is formed on a lateral surface on a first piezoelectric element 33 side, of the insulating film 40, and is inclined such that a thickness dimension on the first piezoelectric element 33 side is smaller than a thickness dimension on a first contact 32 side. In other words, the inclined surface 41 of the insulating film 40 inclines so as to become higher as location shifts in a direction from the first piezoelectric element 33 to the first contact 32.

A plurality of the second contacts 36 are lined up in the arrangement direction on an upper side of the insulating film 40. In the arrangement direction, each of the second contacts 36 is disposed between adjacent two first contacts 32, so as to be separated by a distance D from the first contacts 32. In planar view, the first contacts 32 and the second contacts 36 are disposed in a zigzag manner. Due to the insulating film 40, the first contact 32 and the second contact 36 are separated in the up-down direction, in other words, a thickness direction of the substrate 12*a*. Note that the insulating film 40 is thinner than the substrate 12*a*. The common contact 56 is electrically connected to the common electrode 12*b*. The common contact 56 is provided at both ends of the plurality of second contacts 36. The common contact 56 is held at GND potential.

A plurality of the second piezoelectric elements 37 are lined up in the arrangement direction in the central section of the substrate 12*a* upper surface more to a rear side than the first piezoelectric elements 33. The second piezoelectric elements 37 are each disposed between adjacent two of the first piezoelectric elements 33. The plurality of second piezoelectric elements 37 are covered by the reservoir member 11*a*.

Each of the second contacts 36 and each of the second piezoelectric elements 37 are connected via the second trace 38. The second trace 38 extends to the front side from below the reservoir member 11*a* covering the second piezoelectric element 37. Each of the second contacts 36 and each of the second piezoelectric elements 37 are connected via the first trace 38. The second trace 38 is disposed on an upper surface and the inclined surface 41 of the insulating film 40, and on the upper surface of the substrate 12*a*.

The first flexible substrate 35 is connected, via an adhesive agent A, to the first contact 32, and the second flexible substrate 39 is connected, via the adhesive agent A, to the second contact 36. The first flexible substrate 35 and the second flexible substrate 39 extend toward the front side.

The plurality of pressure chambers 11*m* are formed in the substrate 12*a*, and are disposed on a lower side of each of the first piezoelectric element 33 and the second piezoelectric element 37. The nozzle 11*n* is formed in a bottom surface of the pressure chamber 11*m*. Ink is discharged from the nozzle 11*n* by drive of the first piezoelectric element 33 and the second piezoelectric element 37.

In the first embodiment, the first contact 32 and the second contact 36 are separated in the thickness direction of the substrate 12*a*. When a plurality of the first contacts 32 and the second contacts 36 have been lined up in a direction parallel to the substrate 12*a*, the first contact 32 and the second contact 36 never make contact even if the first contact 32 and the second contact 36 are closely adjacent in the direction parallel to the substrate 12*a*, since the first contact 32 and the second contact 36 are separated in the thickness direction.

Therefore, a dimension of a space between adjacent two first contacts 32 can be set regardless of a dimension of a space between the first contact 32 and the second contact 36. Moreover, a dimension of a space between adjacent two second contacts 36 can be set regardless of the dimension of the space between the first contact 32 and the second contact 36. The dimension of the space between two first contacts 32 and the dimension of the space between two second contacts 36 can be lengthened. In this case, accurate positioning is not required. Moreover, it becomes difficult for a short circuit to occur between traces.

Furthermore, the first contact 32 and the second contact 36 are connected to different flexible substrates 35, 39. Therefore, there is less need for accurate positioning for adhesion, compared to when the first contact 32 and the second contact 36 are in the same plane. Moreover, short circuits between the flexible substrates 35, 39 and the contacts 32, 36 during adhesion can be prevented.

Moreover, the inclined surface 41 is formed in the insulating film 40. The inclined surface 41 smoothly joins the upper surfaces of the insulating film 40 and the substrate 12*a*. Therefore, it is more difficult for the second trace 38 to be disconnected at a boundary portion of the insulating film 40 and the substrate 12*a* compared to when a level difference is formed in the boundary portion. Moreover, since the insulating film 40 is thinner than the substrate 12*a*, the insulating film 40 is easily formed.

In the front-rear direction, in other words, in a direction in which the first piezoelectric element 33 and the second piezoelectric element 37 are lined up, the first contact 32 and the second contact 36 are disposed on an opposite side to the second piezoelectric element 37 from the first piezoelectric element 33. The second piezoelectric element 37, the first piezoelectric element 33, the second contact 36, and the first contact 32 are disposed toward the opposite side in that order. In addition, the insulating film 40 is thinner than the substrate 12*a*. Therefore, in planar view, a difference in lengths of the first trace 34 and the second trace 38 can be reduced, and resistance values of the first trace 34 and the second trace 38 can be set to substantially the same value.

Second Embodiment

Figure 4:
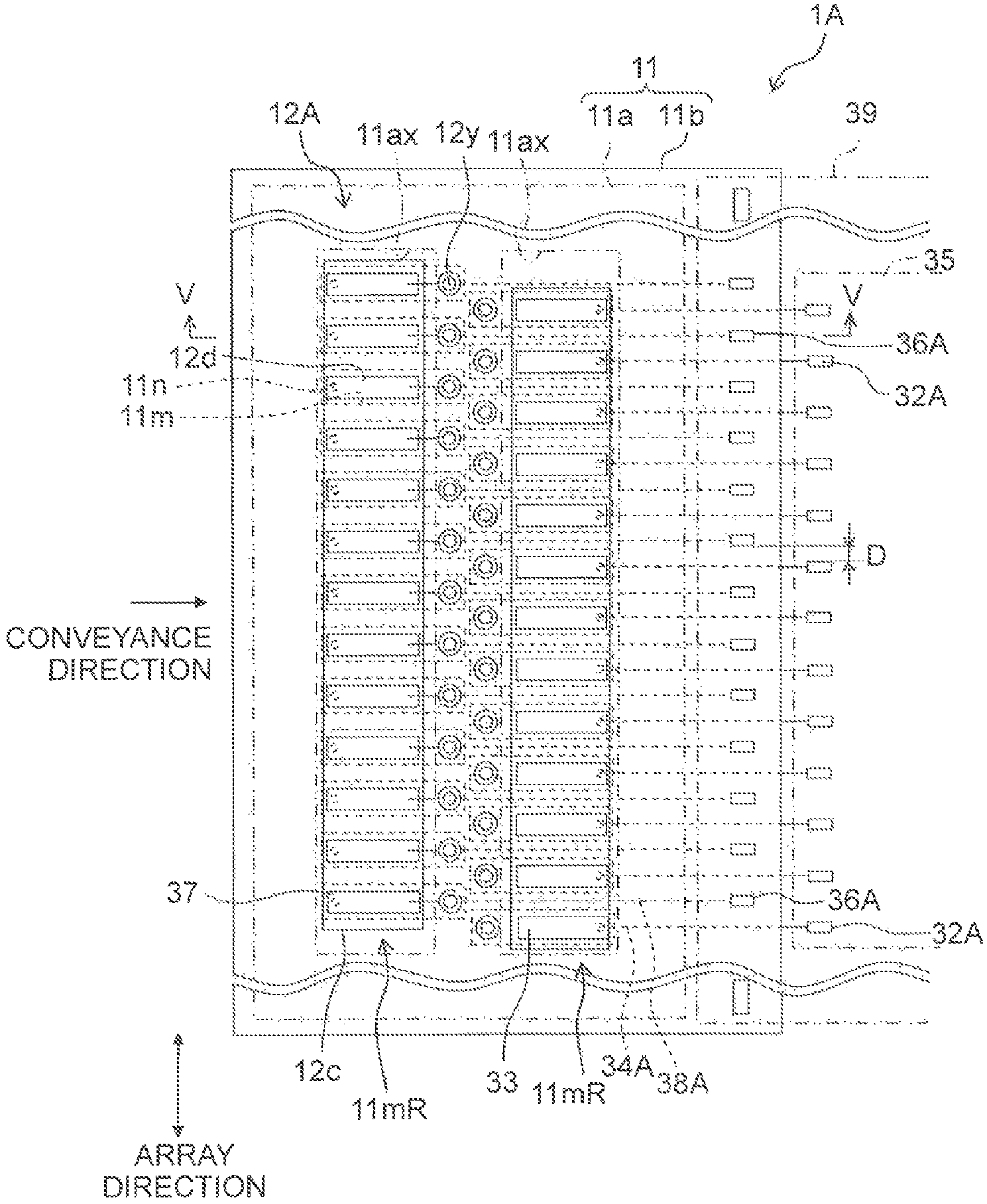
FIG. 4 is a plan view depicting schematically an actuator 12A according to a second embodiment.
Figure 5:
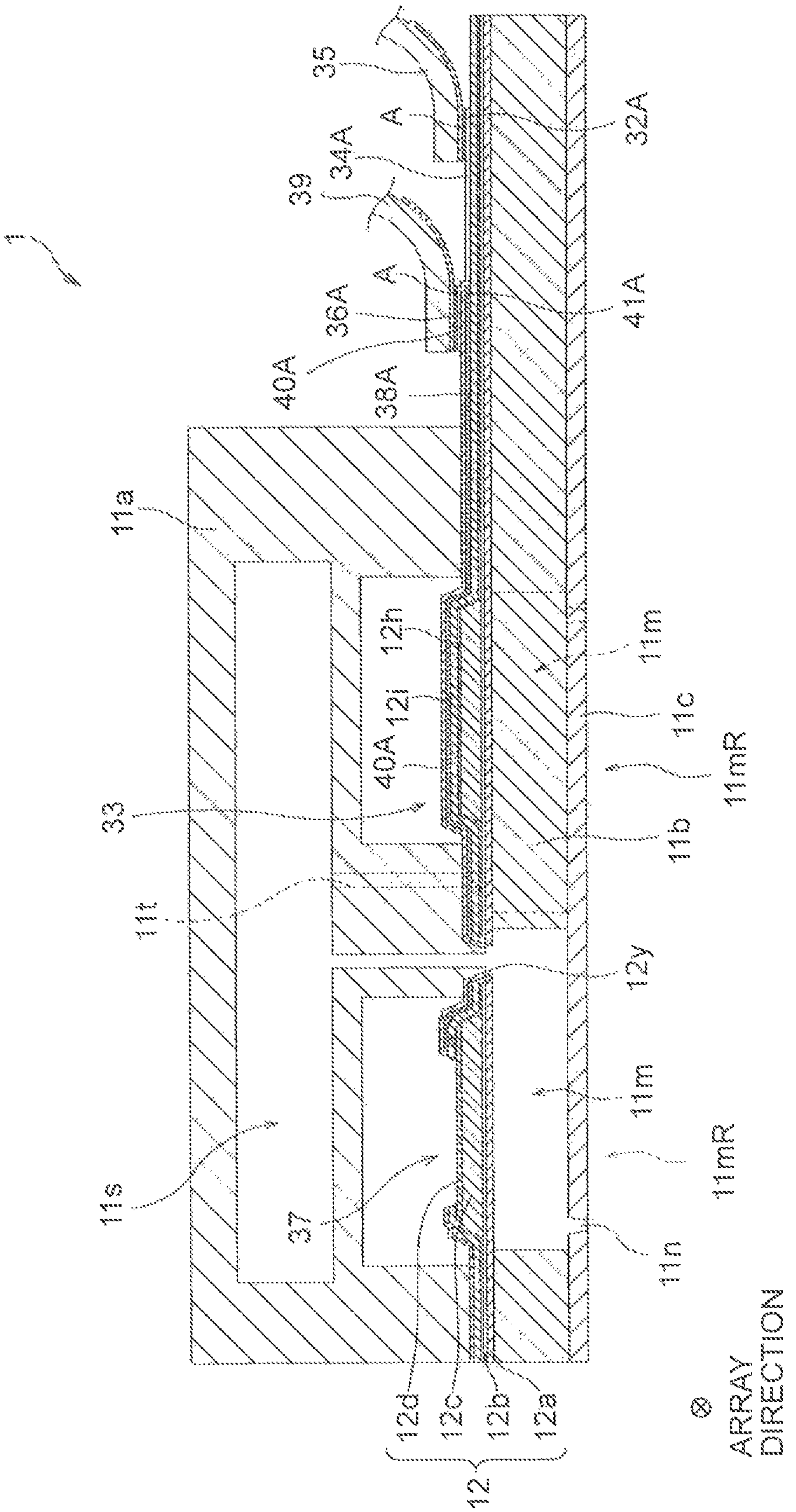
FIG. 5 is a schematic cross-sectional view of the actuator 12A taken along the line V-V depicted in FIG. 4.

Description will be made below based on drawings depicting an actuator 12A according to a second embodiment of the present teaching. Configurations similar to in the first embodiment, of configurations according to the second embodiment will be assigned with the same symbols as those assigned in the first embodiment, and detailed descriptions thereof will be omitted. As depicted in FIGS. 4 and 5, a plurality of first contacts 32A are lined up in the arrangement direction in the front section of the substrate 12*a* upper surface.

Each of the first contacts 32A and each of the first piezoelectric elements 33 are connected via a first trace 34A. The first trace 34A extends to the front side from below the reservoir member 11*a* covering the first piezoelectric element 33. Each of the first contacts 32A and each of the first piezoelectric elements 33 are connected via the first trace 34A.

An insulating film 40A is formed on the substrate 12*a* upper surface. However, the insulating film 40A is not provided in a front edge section of the substrate 12*a* upper surface, a center of the first piezoelectric element 33, and a center of the second piezoelectric element 37. The insulating film 40A is disposed on an upper side of the first trace 34A. The insulating film 40A is thinner than the substrate 12*a*. As depicted in FIG. 5, the first piezoelectric element 33 and the second piezoelectric element 37 are covered by the reservoir member 11*a*. An entire lower end section of the reservoir member 11*a* is provided on the insulating film 40A. In other words, the insulating film 40A is disposed between the reservoir member 11*a* and the substrate 12*a*.

A plurality of second contacts 36A are lined up in the arrangement direction on an upper side of the insulating film 40A more to the front side than the first piezoelectric element 33, and the plurality of second contacts 36A are lined up in the arrangement direction on the upper side of the insulating film 40A more to the front side than the first piezoelectric element 33. Each of the second contacts 36A is disposed between adjacent two first contacts 32A, so as to be separated by the distance D from the first contacts 32A. In planar view, the first contacts 32A and the second contacts 36A are disposed in a zigzag manner. Due to the insulating film 40A, the first contact 32A and the second contact 36A are separated in the up-down direction, in other words, the thickness direction of the substrate 12*a*.

A first through hole 41A penetrating upwardly/downwardly is formed in the insulating film 40A, on a lower side of each of the second contacts 36A. A second trace 38A passes through the first through hole 41A and between the insulating film 40A and the substrate 12*a*. Each of the second contacts 36A and each of the second piezoelectric elements 37 are connected by the second trace 38A.

In the second embodiment, since the insulating film 40A is disposed between the entire lower end section of the reservoir member 11*a* and the substrate 12*a*, the reservoir member 11*a* is raised overall, and it can be avoided that height of one portion of the reservoir member 11*a* becomes a different height from that of another portion of the reservoir member 11*a*. Height of the reservoir member 11*a* can be made uniform.

Moreover, since the insulating film 40A is not provided in the centers of the first piezoelectric element 33 and the second piezoelectric element 37, drive of the first piezoelectric element 33 and the second piezoelectric element 37 is not hindered.

Third Embodiment

Figure 6:
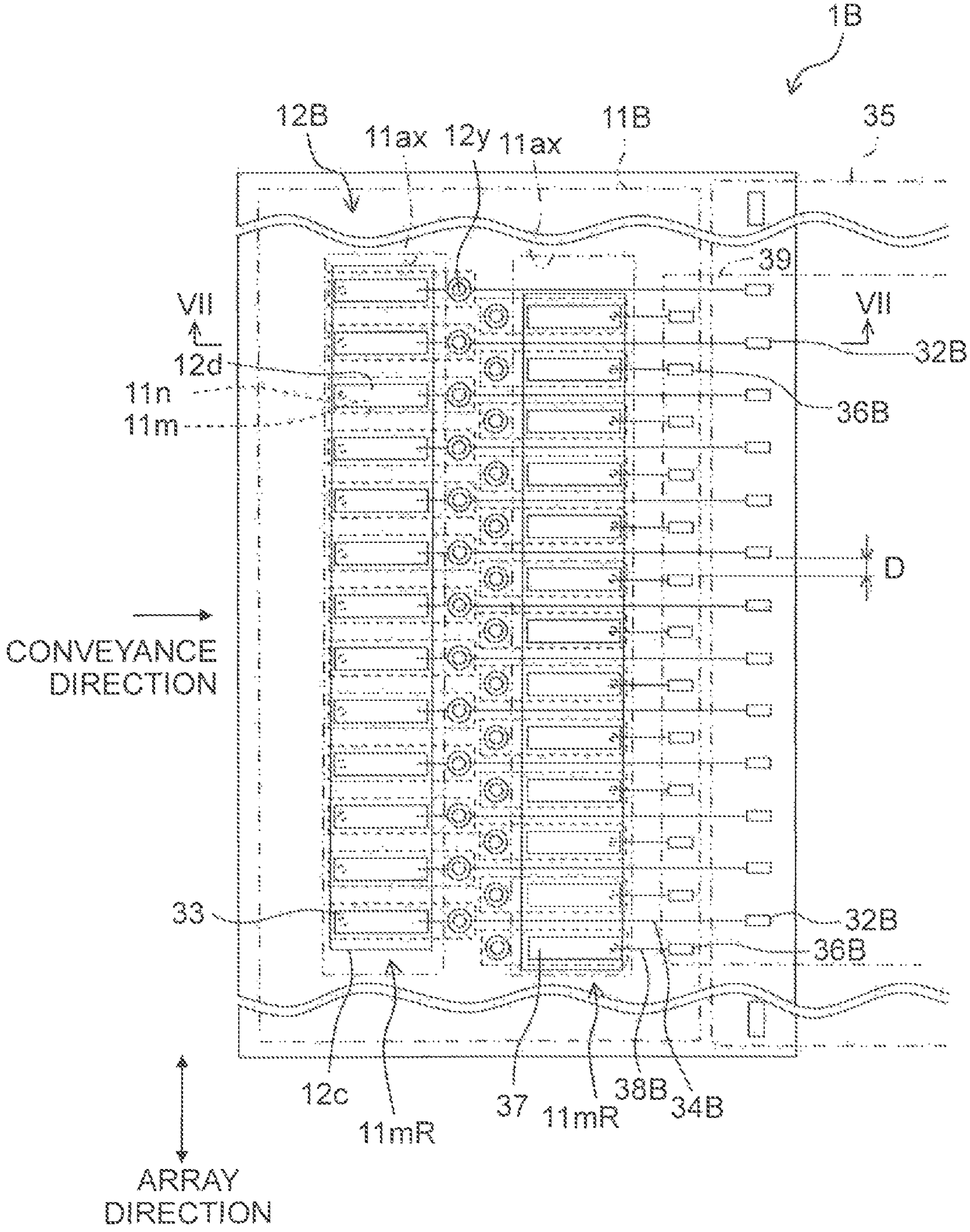
FIG. 6 is a plan view depicting schematically an actuator 12B according to a third embodiment.
Figure 7:
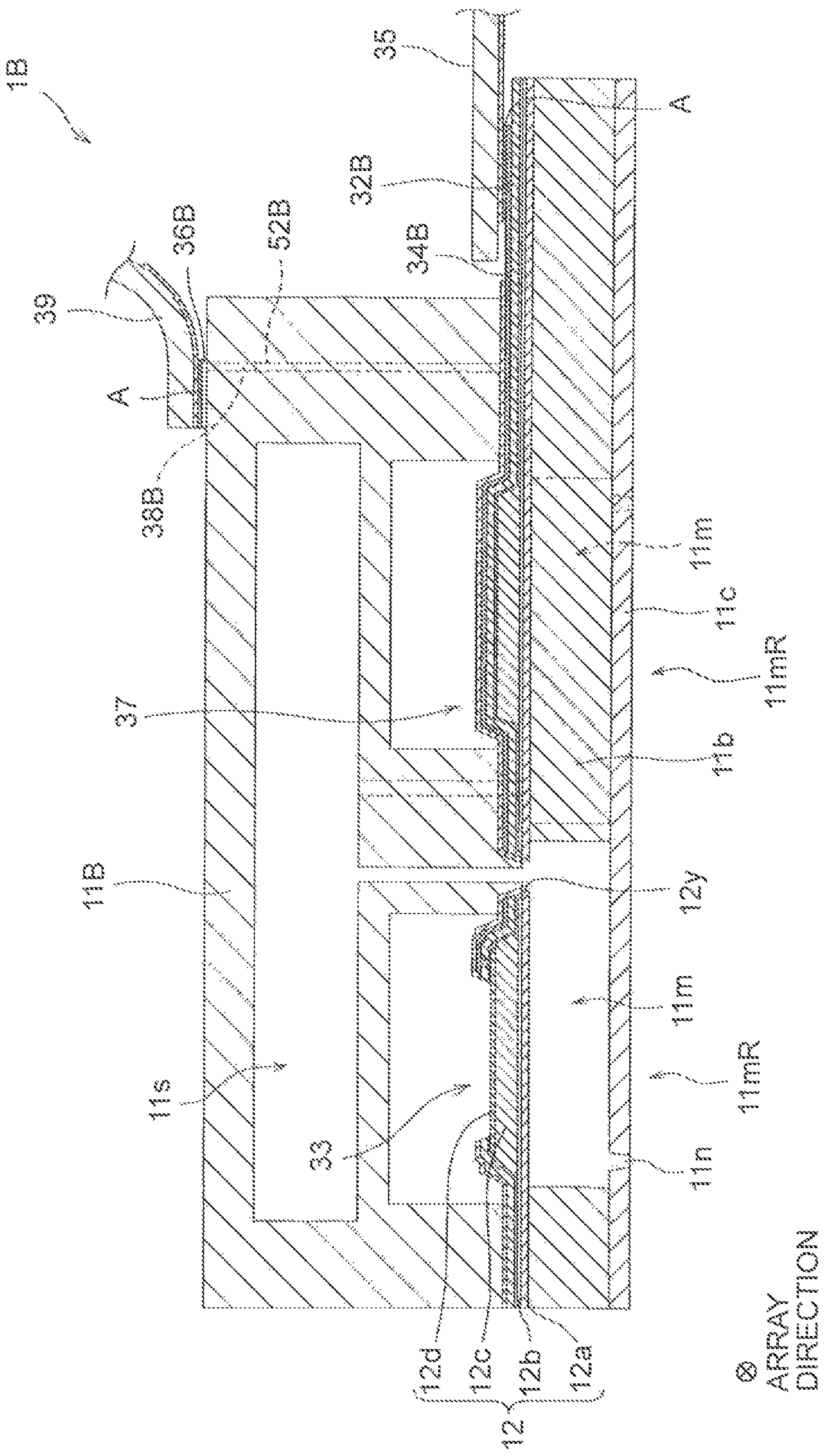
FIG. 7 is a schematic cross-sectional view of the actuator 12B taken along the line VII-VII depicted in FIG. 6.

Description will be made below based on drawings depicting an actuator 12B according to a third embodiment of the present teaching. Configurations similar to in the first and second embodiments, of configurations according to the third embodiment will be assigned with the same symbols as those assigned in the first and second embodiments, and detailed descriptions thereof will be omitted. As depicted in FIGS. 6 and 7, an insulating film is not provided in the substrate 12*a*.

The plurality of first piezoelectric elements 33 are lined up in the arrangement direction in the central section of the substrate 12*a* upper surface. The plurality of first piezoelectric elements 33 are covered by a reservoir member 11B. A plurality of first contacts 32B are each lined up in the arrangement direction in the front edge section of the substrate 12*a* upper surface and form a column.

Each of the first contacts 32B and each of the first piezoelectric elements 33 are connected via a first trace 34B. Each of the first contacts 32B and each of the first piezoelectric elements 33 are connected via the first trace 34B. The first trace 34B extends from below the reservoir member 11B covering the first piezoelectric element 33.

The plurality of second piezoelectric elements 37 are lined up in the arrangement direction, between the first contact 32B and the first piezoelectric element 33, on the substrate 12*a* upper surface. The plurality of second piezoelectric elements 37 are covered by the reservoir member 11B. A second contact 36B is provided in the reservoir member 11B. The first contact 32B and the second contact 36B are separated in the up-down direction, in other words, the thickness direction of the substrate 12*a*. The reservoir member 11B is thicker than the substrate 12*a*.

A second through hole 52B penetrating upwardly/downwardly is provided in the reservoir member 11B covering the second piezoelectric element 37. The reservoir member 11B is joined to the substrate 12*a*. The second through hole 52B is provided in a joining portion of the reservoir member 11B and the substrate 12*a*. A second trace 38B passes through the second through hole 52B. The second piezoelectric element 37 and the second contact 36B are connected by the second trace 38B.

The first flexible substrate 35 is connected, via the adhesive agent A, to the first contact 32B, and the second flexible substrate 39 is connected, via the adhesive agent A, to the second contact 36B. The first flexible substrate 35 and the second flexible substrate 39 extend toward the front side.

In the third embodiment, since the second contact 36B is provided on an upper surface of the reservoir member 11B, the first contact 32B and the second contact 36B are separated in the thickness direction of the substrate 12*a,* and do not make contact. Therefore, there is no need to provide an insulating film between the first contact 32B and the second contact 36B in order to prevent contact of the first contact 32B and the second contact 36B. Moreover, by providing the second through hole 52B, the second trace 38B can be passed through the second through hole 52B, and the second contact 36B and the second piezoelectric element 37 can be connected.

Moreover, in the front-rear direction, in other words, a direction in which the first piezoelectric element 33 and the second piezoelectric element 37 are lined up, the first contact 32B is disposed more to an outer side than the reservoir member 11B, and the first flexible substrate 35 extends in an inclination moving away from the reservoir member 11B. A hole for the first flexible substrate 35 to be passed through, is provided in the head unit. The previously described hole is provided on an outer side in the front-rear direction. When the first flexible substrate 35 extends in an inclination getting closer to the reservoir member 11B, an angle made by the first flexible substrate 35 and the substrate 12*a* becomes steep, and the first flexible substrate 35 easily gets disconnected, since the first contact 32B is disposed on an outer side of the reservoir member 11B.

Moreover, the second flexible substrate 39 extends in the inclination moving away from the reservoir member 11B. Due to the second flexible substrate 39 extending in the same direction as the first flexible substrate 35, the second flexible substrate 39 can be passed through the hole through which the first flexible substrate 35 passes. Therefore, a dimension of the hole need not be made unnecessarily large.

Moreover, in the front-rear direction, the first contact 32B and the second contact 36B are disposed on an opposite side to the first piezoelectric element 33 with respect to the second piezoelectric element 37. The first piezoelectric element 33, the second piezoelectric element 37, the second contact 36B, and the first contact 32B are disposed toward the opposite side (the front side) in that order. The second contact 36B is provided on the reservoir member 11B. Since the reservoir member 11B is thick, a difference in lengths of the first trace 34B and the second trace 38B is large in the up-down direction. In view of the difference in lengths of the traces, the second contact 36B on the reservoir member 11B is connected to the closer of the piezoelectric elements to the second contact 36B in planar view, and a difference in total lengths of the first trace 34B and the second trace 38B can be suppressed.

Moreover, since the reservoir member 11B is thicker than the substrate 12*a,* handling of the actuator 12B is made easy. If only the substrate 12*a,* this is easily broken by being too thin, and handling is difficult.

Moreover, the reservoir member 11B covering the second piezoelectric element 37 is disposed between the first contact 32B and the first piezoelectric element 33 in the front-rear direction. Therefore, the total length of the second trace 38B is shorter compared to that of the first trace 34B, and generation of a short circuit between the first trace 34B and the second trace 38B can be suppressed.

Other modified modes will be described. The printer is not limited to a line printer and may be a serial printer in which the head is scanned in a direction intersecting the conveyance direction. A medium conveyed is not limited to the recording sheet 100, and may be any recordable medium (for example, a fabric or the like).

The reservoir member 11*a* was integrally provided with a portion protecting the piezoelectric body 12*c* and with the reservoir 11*s*. However, a protective member protecting the piezoelectric body 12*c* and the reservoir member having the reservoir may be provided in separate members. Moreover, there need not be a reservoir directly above the piezoelectric body 12*c,* provided the piezoelectric body 12*c* can be protected.

The actuator of the present embodiment is not limited to being applied to a liquid discharge head provided with a flow path and a nozzle, and may be applied to another device.

In the present embodiment, the second contact was provided more to the upper side than the first contact. However, the second contact may be provided more to a lower side than the first contact. All that is required is a configuration where, for example, the piezoelectric body protective film is provided on the whole of the substrate 12*a,* and the interlayer insulating film is provided on the second trace 38 close to the reservoir member 11*a,* but is not provided on the first trace. If this is the case, the second flexible substrate will not make contact with the first trace located on a lower side of the interlayer insulating film, even if the second flexible substrate has been adhered to the second contact. However, in that case, the second flexible substrate and the first trace must be sufficiently separated, hence thickness of the interlayer insulating film must be increased.

The embodiments disclosed this time are in all respects exemplifications and should not be considered limited. The technical features described in each of the embodiments can be combined with each other.

What is claimed is:

1. A device comprising:
an actuator including:
- a substrate;
- a first piezoelectric element located on one surface of the substrate;
- a second piezoelectric element located on the one surface of the substrate;
- a first contact connected to the first piezoelectric element; and
- a second contact separated in a thickness direction of the substrate from the first contact and connected to the second piezoelectric element;

a first flexible substrate connected to the first contact; and
a second flexible substrate connected to the second contact.

2. The device according to claim 1, wherein the actuator further includes:
a first trace connected to the first contact and to the first piezoelectric element; and
a second trace connected to the second contact and to the second piezoelectric element.

3. The device according to claim 2, wherein the actuator further includes an insulating film located on the substrate,
wherein the first contact is located on the substrate, and
wherein the second contact is located on the insulating film.

4. The device according to claim 3, wherein the second trace extends along a lateral surface of the insulating film.

5. The device according to claim 4, wherein the lateral surface of the insulating film includes an inclined surface.

6. The device according to claim 3, wherein a first through hole is located in the insulating film, and wherein the second trace passes through the first through hole.

7. The device according to claim 3, wherein the actuator further includes a protective substrate covering the piezoelectric element and including a joining portion at which the protective substance is joined onto the substrate, and wherein in the joining portion, the insulating film is located between the protective substrate and the substrate.

8. The device according to claim 7, wherein the insulating film is located to cover the whole of the joining portion.

9. The device according to claim 3, wherein the piezoelectric element is not located on the insulating film.

10. The device according to claim 3, wherein in a direction in which the first piezoelectric element and the second piezoelectric element are aligned, the first piezoelectric element is located between the second contact and the second piezoelectric element, and wherein in the direction, the second contact is located between the first piezoelectric element and the first contact.

11. The device according to claim 3, wherein the insulating film is thinner than the substrate.

12. The device according to claim 10, wherein the first flexible substrate and the second flexible substrate extend in the direction.

13. The device according to claim 2, wherein the actuator includes a protective substrate covering the piezoelectric element, wherein the second contact is located on the protective substrate.

14. The device according to claim 13, wherein the protective substrate includes a joining portion at which the protective substance is joined onto the substrate, wherein a second through hole is located in the joining portion, and wherein the second trace passes through the second through hole.

15. The device according to claim 13, wherein in a direction in which the first piezoelectric element and the second piezoelectric element are aligned, the first contact is located on the substrate on an outer side of the protective substrate, and wherein the first flexible substrate extends in an orientation moving away from the protective substrate.

16. The device according to claim 15, wherein the second flexible substrate extends in the orientation moving away from the protective substrate.

17. The device according to claim 13, wherein in a direction in which the first piezoelectric element and the second piezoelectric element are aligned, the second piezoelectric element is located between the second contact and the first piezoelectric element, and wherein in the direction, the second contact is located between the second piezoelectric element and the first contact.

18. The device according to claim 13, wherein the protective substrate is thicker than the substrate.

19. The device according to claim 13, wherein the first contact is located on the substrate, and wherein the protective substrate is located between the first piezoelectric element and the first contact.

* * * * *